Figure 1A:
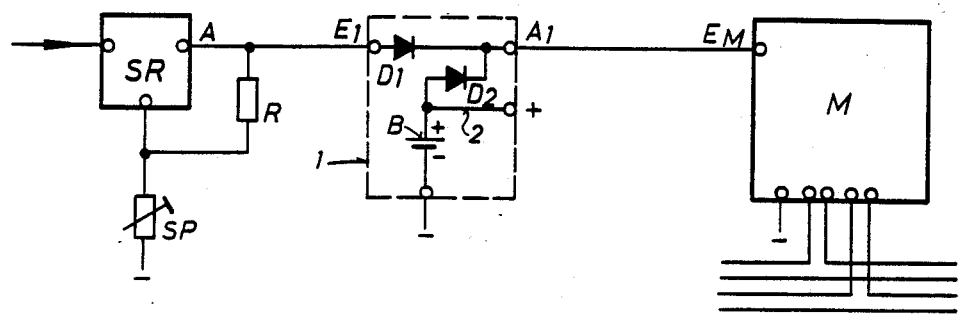

United States Patent [19]

Wyser et al.

[11] Patent Number: 4,658,151
[45] Date of Patent: Apr. 14, 1987

[54] BATTERY-SUPPORTED INTEGRATED SWITCHING ELEMENT

[75] Inventors: Paul Wyser; Heinrich Uebelhart, both of Itingen, Switzerland

[73] Assignee: Renata AG, Itingen, Switzerland

[21] Appl. No.: 696,010

[22] Filed: Jan. 29, 1985

[30] Foreign Application Priority Data

Feb. 20, 1984 [CH] Switzerland ............................ 813/84

[51] Int. Cl.$^4$ ................................................ H02J 9/02
[52] U.S. Cl. ......................................... 307/66; 307/64
[58] Field of Search ..................... 307/64, 66, 146, 147

[56] References Cited

U.S. PATENT DOCUMENTS 4,182,110  1/1980  Kamiwaki et al. ................ 307/64 X
4,381,458  4/1983  Anstey et al. ..................... 307/64 X Primary Examiner—William M. Shoop, Jr.
Assistant Examiner—Sharon D. Logan
Attorney, Agent, or Firm—Kenway & Jenney

[57] ABSTRACT

The circuit element contains inside a cup-shaped plastic housing (3) a gas-tight primary battery (B) and a wiring arrangement which is arranged next to the battery (B) in the hollow space (3') of the housing and which comprises semiconductor switching elements ($D_1$, Tr) and conductor connections (8, 13/13', 15, 16). The battery (B) and wiring arrangement are hermetically disposed in the housing (3) as a result of a casting compound (19).

The switching element is provided with plug-in pins (13/13', 16) which are brought out to its surface and which can be directly soldered into a circuit board. Switching elements of this type can be used especially as backup voltage source for memory systems of the non-self-holding type.

7 Claims, 7 Drawing Figures

BATTERY-SUPPORTED INTEGRATED SWITCHING ELEMENT

The present invention relates to a battery-supported integrated switching element.

In electronic memory circuits containing external voltage supplies, it is customary to wire memory circuits which are not self-holding with external batteries in order to avoid memory contents from being lost in case of a failure of the external voltage. This method is disadvantageous in the configuring of such circuits, especially when equipping circuit boards, because, on the one hand, the wiring components for battery operation must be arranged separately and, on the other hand, the batteries are not well suited to being installed with automatic component-loading machines and to soldering on the conveyor belt for various reasons. In addition, such batteries should be suitable for long-term operation and preferably remain ready for operation for the entire life of a memory circuit. A battery, which is placed onto a circuit board without special protective measures against corrosion, contamination, moisture and suchlike causes of leakage power losses, is therefore latently at risk and offers little reliability for operational readiness in long-term use.

The present invention has the object therefore of creating a battery-supported integrated switching element in which the battery together with the wiring elements needed for its operation are accommodated in a hermetically closed housing and only the connection terminals typical of a specific switching element arrangement project past the component for direct installation on a circuit board.

This object is achieved by the characterizing features defined in claim 1. Special embodiments thereof are characterized by the dependent claims.

In the text which follows, illustrative embodiments of the switching element of the invention are described with the aid of diagrams of a backup supply element and two embodiments. In the drawing, FIGS. 1a–c show circuit examples for use in the switching element, and FIGS. 2a, b and 3a, b each show a top view and a side view in partial section of the switching element.

Figure 1B:
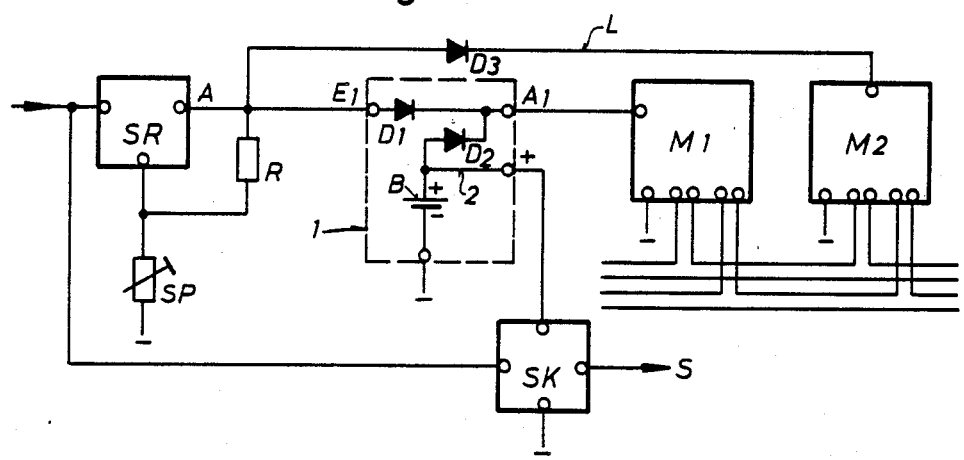
Figure 1C:
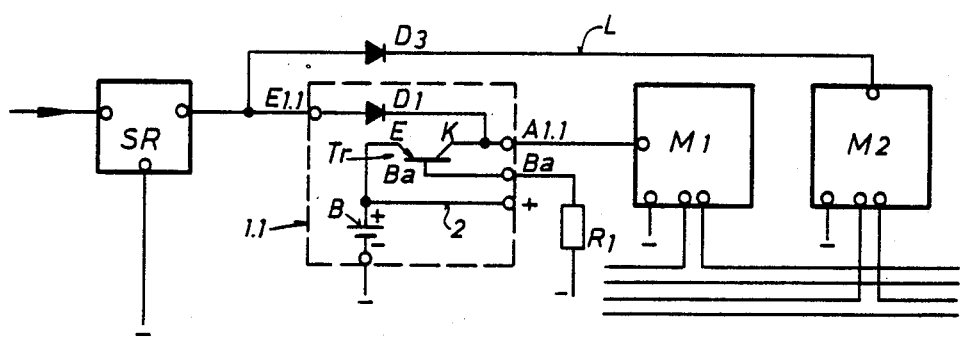

FIG. 1a shows an integrated switching 1 according to the invention in a memory supply circuit comprising a supply voltage regulator SR which is wired with feedback means R and a control potentiometer SP and which precedes the input of the switching element 1. The output A of the supply voltage regulator SR is directly connected to the input $E_1$ of the switching element 1.

M generally designates a memory system in which at least a part of the memory elements, in order to maintain their memory state, must either always be under voltage or can maintain a memory state only in case of shortterm supply voltage failure. In the present case, the switching element 1 contains a semiconductor wiring arrangement comprising a diode $D_1$ which is located in the conductor path $E_1$-$A_1$ and which applies the necessary operating voltage to the memory system input $E_M$ for the case that the external voltage supply is operating.

In addition, the switching element 1 contains a single- or multi-cell primary battery B of extremely long life, for example a lithium battery of the gas-tight type, the positive pole of which is connected via a second diode $D_2$ in the direction of current flow after the diode $D_1$ to the conductor path $E_1$-$A_1$. The positive pole of the battery B is suitably connected via an internal connection 2 to the externally accessible positive terminal (+) of the switching element 1. This makes it possible, for example, to monitor the charging condition of the battery. Similarly, the negative pole of the battery is directly connected to the externally accessible negative terminal (−) of the switching element 1.

Operationally, at the input $E_1$ a voltage is present which is a little higher than the long-term operating voltage of the battery (B). This ensures that, if the input $E_1$ carries a voltage, a blocking voltage is present at $D_2$ which prevents current from flowing from the battery B to the output $A_1$. The memory system M is thus supplied from the external voltage source via the voltage regulator SR, the input $E_1$ at the switching element 1 and the diode $D_1$.

If the external voltage supply described fails, the diode 2 makes it possible for current to flow from the battery B to the output $A_1$ and to the memory system input $E_M$. Input $E_1$, output $A_1$ and the (+) and (−) terminals at the switching element are brought out of the physical area of the latter in the form of plug-in pins (see in FIGS. 2a, b and 3a, b).

FIG. 1b shows the switching element 1 of the embodiment described above in a complex memory circuit comprising a memory system $M_1$ containing non-self-holding memory elements and a memory system $M_2$ which does not require any continuous supply. Bypassing the switching element 1, the latter is connected via an external diode $D_3$ and the line L to the input A of the voltage regulator SR which, in principle, can be wired identically to that shown in FIG. 1a. The memory system $M_1$ corresponds to the abovementioned memory system M and is connected, with interposed effectively identical switching element 1 to the external current source or the voltage regulator SR. Essentially, the difference is that the circuit of FIG. 1b still contains a voltage comparing or monitoring circuit SK which supplies an indicating signal S if the external supply voltage fails and drops below a threshold value.

FIG. 1c shows a simplified further circuit variant in derivation of FIG. 1b. Instead of the second diode $D_2$ from the former figures, the switching element 1.1 shown in the last-mentioned figure contains a transistor Tr the emitter E of which is connected to the positive pole of the battery B and the collector K of which is connected to the input of the memory system $M_1$. The base Ba of the transistor is connected via a resistor $R_1$ to the negative pole of the circuit. In principle, the type of the memory systems $M_1$ and $M_2$ corresponds to that of FIG. 1b. The operation of the circuit internal to the circuit element 1.1 corresponds to that from FIGS. 1a and 1b. However, use of a transistor (including a field effect transistor) makes it possible to reduce considerably the voltage drop as compared with the diode. The voltage drop is therefore much less which makes it possible to increase the usable capacity of the battery.

In principle, the wiring internal to the switching element is not restricted to the examples shown in FIGS. 1a–c. The number of connecting pins, corresponding to terminals $E_1$, $A_2$, +/− and so forth, is also not limited so that, for example in the case of switching elements 1, 1.1 comprising two or more series-connected batteries, intermediate voltage taps can also be brought out in order, for example, to be able to operate independent circuit or memory sections and suchlike with partial voltages.

Figure 2B:
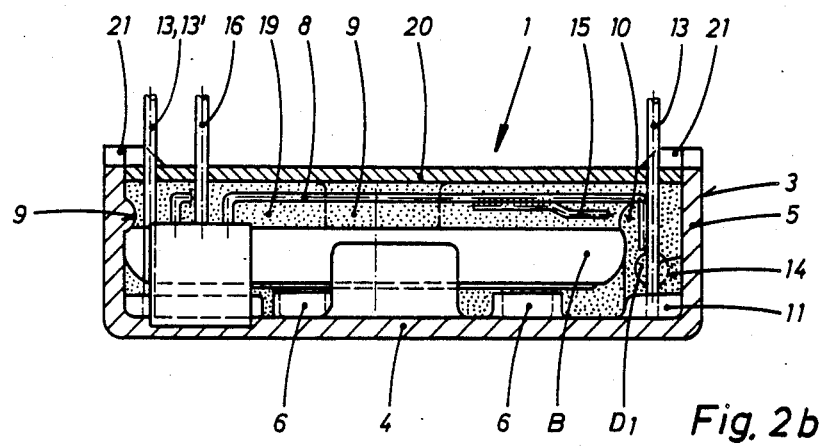
Figure 2A:
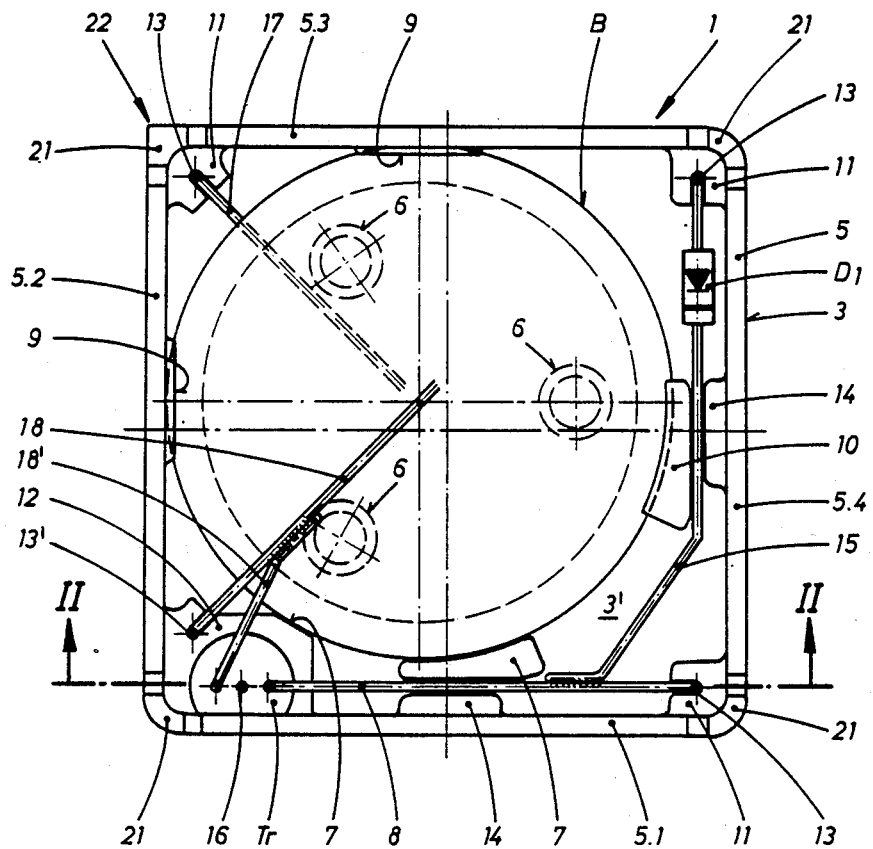

A first practical embodiment of the circuit element 1 is shown in FIGS. 2a and 2b. One top view and one section (along line II—II in FIG. 2a ) each show the position of the battery B within a cup-shaped plastic housing 3. The plastic housing is shown in the "filling" position for the circuit components and accordingly is on its head, that is to say the components shown to be located on top are located at the bottom in the position of use. Accordingly, the plate 4 shown as the base part of the housing is in reality the cover plate of the housing 1 which is seamlessly joined to the side walls 5. In the hollow space 3' of the housing, centering means are arranged or integrally moulded with the housing, both for the battery B and for the circuit components, these centering means being (a) a number of spacers 6 (three are shown), which are arranged with approximately uniform distribution, for securing the battery B in approximately parallel alignment with the cover plate 4, (b) lateral spacers 7 which keep the battery B at a distance from the side wall 5.1 in order to secure space for a conductor element 8, (c) holding noses 9 moulded onto the side walls 5.2 and 5.3, and d) a clamping tightening member 10 which essentially overlaps the battery B like the holding noses 9 and additionally forces it against other stop members, the side walls 5.2 and 5.3 in the example shown.

The housing 3 is also provided with corner sockets 11, 12, accommodating the one end of plug-in pins 13, 13' which project past the housing 3, and with clamping toes 14 for the local fixing of conductor elements 8 and 15. The corner socket 12 is suitably constructed in such a manner that, apart from accommodating a plug-in pin, it is also usable for centering the transistor Tr or, if necessary, a diode (for example $D_2$ of FIG. 1a, 1b). The diode $D_1$ can be arranged in the conductor element 15 at any place of this conductor element where sufficient distance exists from the battery surface.

The plug-in pins 13, 13' are arranged in an asymmetrical area pattern which prevents connection mistakes. In this arrangement, the three plug-in pins 13 are suitably located in three corners of a square configuration whilst the fourth plug-in pin 13' is arranged outside this configuration. A plug-in pin 16, which is additional in the case of transistor Tr, can be placed directly onto the base or gate electrode.

The battery B, which can be established in various manners, in deviations from the described holding means 6, 7, 9, 10, in the interior of the housing 3 and which is provided with pole connection conductors 17, 18, can be inserted into its holder by finger pressure. After the plug-in pins 13, 13' have been inserted, the circuit components Tr in $D_1$ together with their conductor connections are inserted and the remaining hollow space is then filled, free of air inclusions, with an electrically insulating thermosetting casting resin 19 which is resistant against the battery electrolyte. The housing opening can be closed, even before the casting resin 19 has set, with a closing plate 20 which rests at least partially on the casting resin and the surface of which is flush with the edge of the opening. In this arrangement, the closing plate 20 contains openings, which correspond to the openings in the corner sockets 11, 12, for guiding the plug-in pins 13 and the pin 16 at the top.

In order to keep the switching element at a distance if it is mounted on a circuit board, toes 21 are placed in the corners of the side walls 5.1-5.4. So that the circuit elements can be rapidly and reliably oriented congruently with respect to their connections even from the top of the switching element, that is to say without orientation in accordance with the plug-in pin configuration, one of these corners, in deviation from the others, is constructed as a locating corner 22.

Figure 3B:
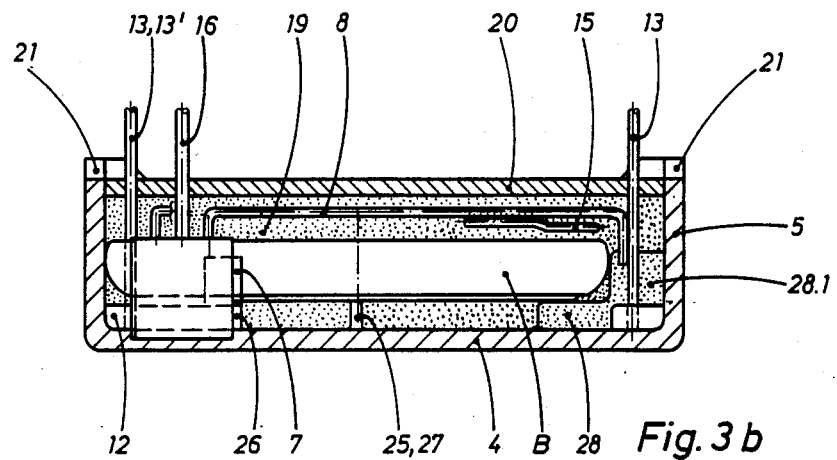
Figure 3A:
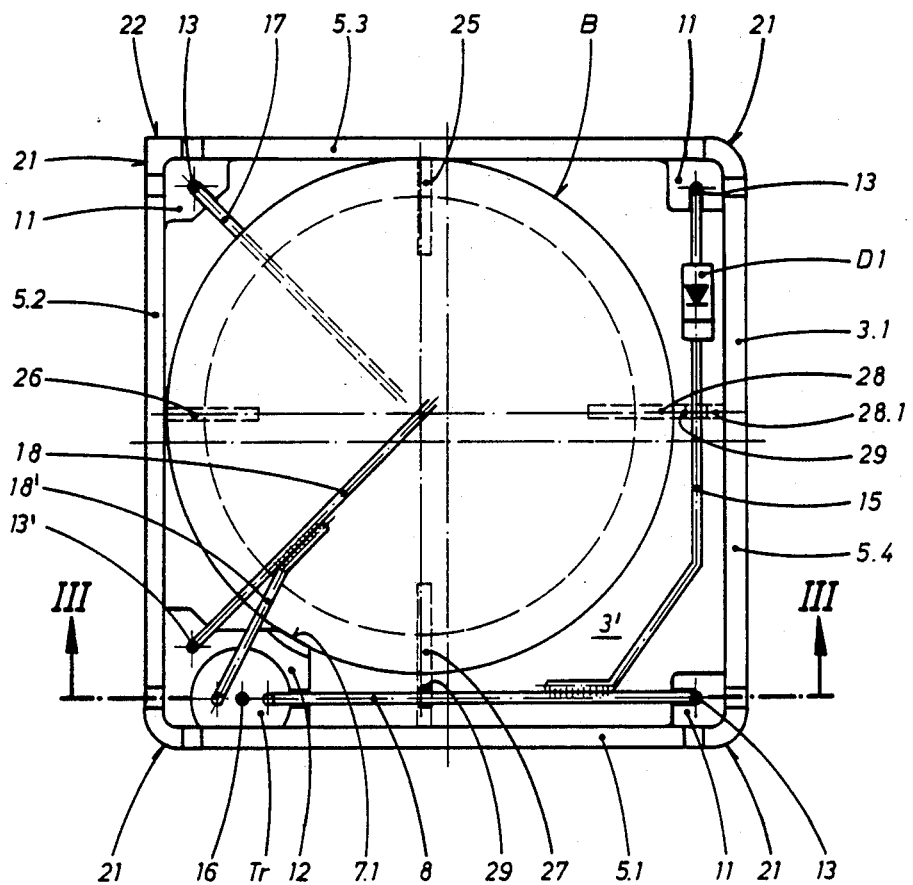

FIGS. 3a, 3b show an embodiment of the circuit element which externally corresponds to that of FIGS. 2a, 2b and which, in this respect, will not be described in further detail. Similarly, an internal circuit configuration is shown which corresponds to that mentioned above. In contrast, the holding means of the battery B in the hollow space of the housing 3.1 is considerably more simple. For this purpose, four base support webs 25, 26, 27, 28 are provided which pass below the underside of the battery B, starting from the respectively adjacent side walls 5.1-5.4. In the example shown, the battery B is laterally centered by the side walls 5.2, 5.3 of the housing, the spacer 7.1 at the corner socket 12 and at the raised part 28.1 of the base support web 28 in the housing 3.1. The corner socket 12 is constructed to be virtually identical to that in FIGS. 2a, 2b and provided for holding the transistor Tr or a corresponding other switching element, and the plug-in pin 13'. The base support webs 27, 28 and the raised part 28.1 of the latter are provided with clamping grooves 29 for fixing the conductor elements 8 and 15 inside the housing 3.1 and at a distance from the battery B.

FIG. 3b corresponds to the section along line III—III in FIG. 3a.

The battery B, the conductor elements 8, 15, 17,18, 18', the plug-in pins 13, 13' and the circuit members Tr and $D_1$ are suitably connected to each other outside the housing and inserted into the hollow space of the housing 3, 3.1 before or after the casting resin 19 has been filled into this hollow space.

The hollow space 3' of the housing is covered by a closing plate 20 which is provided with passage openings in a pattern of distribution corresponding to the openings in the corner sockets 11, 12, constructed as lower guide elements.

It is understood that the housing 3, 3.1 can be altered in shape and size and can be provided with internal support and centering means which in themselves can be designed in any way, in order to be able to accommodate a battery and the associated wiring.

We claim:

1. A battery-supported integrated switching element, comprising a cup-shaped housing (3;3') provided with a hollow space (3'), containing:
    a primary battery (B) of the gas-tight type; a number of spacers (6; 25-28) which keep the battery (B) at a distance from a cover plate (4) in the hollow space (3') of the housing, and a number of stop elements (5.2, 5.3, 7, 10; 5.2, 5.3, 7.1, 28.1) which laterally center the battery in the hollow space (3') of the housing;
    a wiring arrangement consisting of semiconductor switching elements and conductor connections (8, 13/13', 15-18/18') and a number of holding devices (11, 12, 14, 29) which fix the wiring elements in the hollow space of the housing; and
    a casting compound (19) which envelops in a gastight manner the battery (B) and the wiring elements in the hollow space of the housing.

2. A switching element as claimed in claim 1, wherein the conductor connections comprise plug-in pins (13,

13′) which are preferably disposed in the corner areas of the hollow space and the one end of which is centered in a socket (11, 12) which is connected to the housing (3).

3. A switching element as claimed in claim 1, wherein the stop elements, which laterally center the battery (B), are provided with members (9, 10) which elastically enclose the battery.

4. A switching element as claimed in claim 2, wherein the opening of the housing is closed with a closing plate (20) which rests at least partially on the casting compound (19) and which is also centered by the plug-in pins (13, 13′) in the vicinity of its outer end.

5. A switching element as claimed in any of claims 1 to 4, wherein the side walls of the housing (5.1–5.4) are provided, preferably in the corner areas, with projecting spacing toes (21) and one of these corner areas is constructed, in deviation from the other corner areas, as a locating corner (22).

6. A switching element as claimed in one of claims 1 to 5, wherein the wiring arrangement contains a diode ($D_1$) which is connected in the direction of current conduction and which is built into a feed-through conductor path ($E_1$-$A_1$), and a further diode ($D_2$) which connects the positive pole of the battery (B) after the first diode ($D_1$) to the feed-through conductor path ($E_1$-$A_1$).

7. A switching element as claimed in one of claims 1 to 5, wherein the wiring arrangement contains a diode (D1), which is connected in the direction of current conduction and which is built into a feed-through conductor path ($E_{1.1}$-$A_{1.1}$) and a transistor (Tr) which connects the positive pole of the battery (B) after the diode ($D_1$) to the feed-through conductor path ($E_{1.1}$-$A_{1.1}$).

* * * * *